(12) United States Patent
Kim et al.

(10) Patent No.: US 10,629,845 B2
(45) Date of Patent: Apr. 21, 2020

(54) DISPLAY DEVICE INCLUDING A BARRIER LAYER

(71) Applicant: SAMSUNG DISPLAY CO., LTD., Yongin-si, Gyeonggi-Do (KR)

(72) Inventors: Joonghyun Kim, Yongin-si (KR); Kyongtaeg Lee, Yongin-si (KR); Sangyoung Park, Yongin-si (KR); Kyungsuk Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/157,749

(22) Filed: Oct. 11, 2018

(65) Prior Publication Data

US 2019/0288234 A1 Sep. 19, 2019

(30) Foreign Application Priority Data

Mar. 16, 2018 (KR) .................... 10-2018-0031103

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3276* (2013.01)

(58) Field of Classification Search
CPC ............. H01L 51/0097; H01L 51/5253; H01L 51/5254; H01L 27/3223; H01L 27/323; H01L 27/3246; H01L 27/3276
See application file for complete search history.

(56) References Cited

U.S. PATENT DOCUMENTS

| 2016/0204373 | A1 | 7/2016 | Park |
| 2018/0097200 | A1 | 4/2018 | Park et al. |
| 2018/0151838 | A1* | 5/2018 | Park .................... H01L 51/5253 |
| 2018/0205037 | A1 | 7/2018 | Kim et al. |
| 2019/0006442 | A1* | 1/2019 | Byun .................. H01L 51/5253 |

FOREIGN PATENT DOCUMENTS

| JP | 2007-194062 | 8/2007 |
| KR | 1020120072173 | 7/2012 |
| KR | 1020150025994 | 3/2015 |
| KR | 1020160087982 | 7/2016 |
| KR | 1020170090382 | 8/2017 |

* cited by examiner

*Primary Examiner* — Cuong Q Nguyen
(74) *Attorney, Agent, or Firm* — F. Chau & Associates, LLC

(57) ABSTRACT

A display device includes a substrate including a display area and a peripheral area surrounding the display area; a display element in the display area and electrically connected to a thin film transistor; a power supply line in the peripheral area; an insulating layer covering a portion of the power supply line; and a barrier layer on the insulating layer and including a first side surface facing the display area and a second side surface that is opposite to the first side surface, wherein at least one of the first side surface and the second side surface includes a concavo-convex surface, wherein the barrier layer forms a step difference with respect to an upper surface of the insulating layer, and an end of the insulating layer extends from the display area in a direction toward an edge of the substrate beyond the second side surface of the barrier layer.

24 Claims, 10 Drawing Sheets

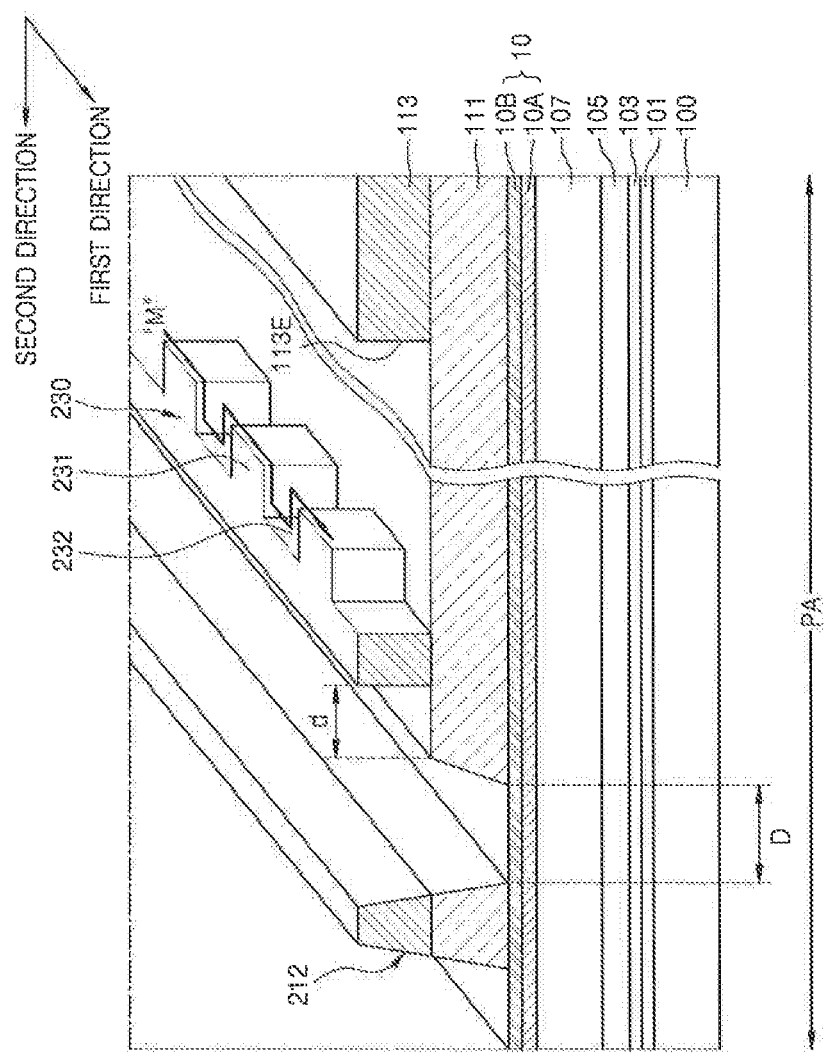

DISPLAY DEVICE INCLUDING A BARRIER LAYER

DETAILED DESCRIPTION OF THE INVENTION

Technical Field

One or more embodiments relate to a display device.

Prior Art

As display devices visually displaying electrical signals have been developed, they have been used for various purposes. As the usage of the display devices has been diversified, the display devices having a reduced non-display area and providing a high quality image have been designed.

DISCLOSURE OF THE INVENTION

Technical Goal of the Invention

Display devices may be sealed by a sealing member including an inorganic layer and an organic layer. Here, with a decrease in an area of a non-display area, efforts to reduce an area of the non-display area, the area being occupied by the organic layer of the sealing member, are required. One or more embodiments aim to address various issues including the issue described above and include a display device having a reduced non-display area. However, it is an example, and the scope of the present disclosure is not limited thereto.

Means for Achieving Technical Goal

According to one or more embodiments, a display device may include: a substrate including a display area and a peripheral area surrounding the display area; a display element disposed in the display area and electrically connected to a thin film transistor; a power supply line disposed in the peripheral area; an insulating layer covering a portion of the power supply line; and a barrier layer disposed on the insulating layer and including a first side surface facing the display area and a second side surface that is opposite to the first side surface, wherein at least one of the first side surface and the second side surface includes a concavo-convex surface, wherein the barrier layer forms a step difference with respect to an upper surface of the insulating layer, and an end of the insulating layer extends beyond the second side surface of the barrier layer in a direction from the display area toward an edge of the substrate.

The display device may further include: a planarization layer between the thin film transistor and the display element; and a pixel-defining layer disposed on a pixel electrode of the display element and defining an opening exposing the pixel electrode.

The insulating layer may include the same material as the planarization layer, and the barrier layer may include the same material as the pixel-defining layer.

The barrier layer may be spaced apart from the pixel-defining layer by a certain distance.

The power supply line may include a body portion extending along an edge of the display area and a connection portion extending from the body portion toward the edge of the substrate so as to cross the body portion, and the barrier layer may overlap the body portion of the power supply line.

An end edge of the connection portion may have a concavo-convex structure based on a direction perpendicular to the substrate.

The display device may further include: a terminal disposed in the peripheral area and corresponding to a first side of the display area, and the power supply line may be disposed between the first side of the display area and the terminal.

The barrier layer may extend to surround the display area.

The display device may further include a dam surrounding the display area.

The barrier layer may be between an edge of the display area and the dam.

According to one or more embodiments, a display device may include: a substrate including a display area and a peripheral area outside the display area; a thin film transistor disposed in the display area; a pixel electrode electrically connected to the thin film transistor; an insulating layer between the thin film transistor and the pixel electrode; a power supply line disposed in the peripheral area and having a portion thereof covered by the insulating layer; and a barrier layer disposed in the peripheral area to overlap the power supply line, and including a first side surface facing the display area and a second side surface that is opposite to the first side surface, wherein at least one of the first side surface and the second side surface has a concavo-convex surface, wherein the barrier layer forms a step difference with respect to an upper surface of the insulating layer.

The display device may further include: a pixel-defining layer defining an opening exposing the pixel electrode; an emission layer overlapping the pixel electrode through the opening of the pixel-defining layer; and an opposite electrode on the emission layer.

The barrier layer may be spaced apart from the pixel-defining layer by a certain distance.

An end of the insulating layer may extend beyond the second side surface of the barrier layer toward an edge of the substrate.

The power supply line may include a main power supply line portion extending along a first side of the display area, and the barrier layer may overlap the main power supply line portion.

The display device may further include a terminal disposed in the peripheral area around the first side of the display area, and the power supply line may further include a connection portion extending in a direction crossing the main power supply line portion and connecting the main power supply line portion with the terminal.

An end edge of the connection portion may have a concavo-convex structure based on a direction perpendicular to the substrate.

The display device may further include a plurality of driving voltage lines extending onto the display area and electrically connected to the thin film transistor, and the power supply line may supply a first power supply to the plurality of driving voltage lines.

The display device may further include a thin film encapsulation layer covering the display area and including at least one organic encapsulation layer and at least one inorganic encapsulation layer, and the at least one organic encapsulation layer may extend to the peripheral area so as to cover the barrier layer.

Other aspects, features, and advantages will become apparent from the following drawings, claims, and detailed description.

Effect of the Invention

According to the one or more of the embodiments described above, the flow of the liquid organic material for forming the organic encapsulation layer may be delayed via the barrier layer provided at an inner portion of the dam, and thus, an area of the peripheral area of the display element may be reduced. It should be understood that embodiments described herein should be considered in a descriptive sense only and not for purposes of limitation.

BRIEF DESCRIPTION OF THE DRAWINGS

FIG. 7 is a perspective cross-sectional view of a first dam, a barrier layer, and portions around the first dam and the barrier layer of a display device, according to an embodiment;

DESCRIPTION OF EMBODIMENT

Figure 1:
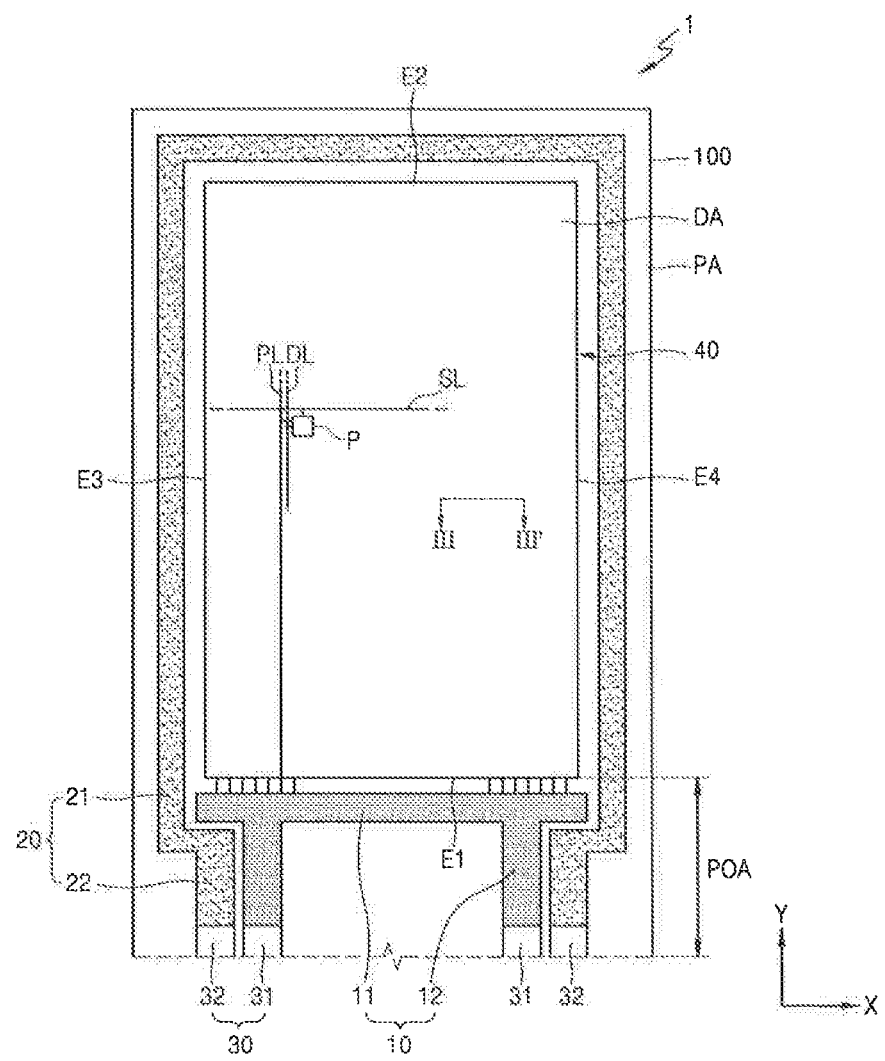
FIG. 1 is a schematic plan view of a display device according to an embodiment.

The present disclosure may have various modifications and embodiments, and certain embodiments will be illustrated in the drawings and described in detail in the detailed description. The effects, characteristics, and methods of achieving the effects and the characteristics of the present disclosure will be made clear with reference to the embodiments described below in detail with reference to the drawings. However, the present disclosure is not limited to the embodiments described hereinafter, and may be realized as various embodiments.

Hereinafter, the embodiments of the present disclosure will be described in detail with reference to the accompanying drawings. Like reference numerals refer to like elements, and their repeated descriptions will not be given.

It will be understood that although the terms "first," "second," etc. may be used herein to describe various components, these components should not be limited by these terms.

These components are only used to distinguish one component from another.

As used herein, the singular forms "a," "an," and "the" are intended to include the plural forms as well, unless the context clearly indicates otherwise.

It will be understood that when a layer, region, or component is referred to as being "formed on," another layer, region, or component, it can be directly or indirectly formed on the other layer, region, or component.

That is, for example, intervening layers, regions, or components may be present. Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. That is, for example, intervening elements, areas, or layers may be present. For example, it will be understood in this specification that when an element, an area, or a layer is referred to as being in contact with or being electrically connected to another element, area, or layer, it can be directly or indirectly in contact with or electrically connected to the other element, area, or layer. That is, for example, intervening elements, areas, or layers may be present.

A display device is a device configured to display an image, and may include a liquid crystal display (LCD) device, an electrophoretic display device, an organic light-emitting display device, an inorganic light-emitting display device, a field-emission display device, a surface-conduction electron-emitter display device, a plasma display device, a cathode ray display device, etc.

Hereinafter, as a display device according to an embodiment, an organic light-emitting display device will be described. However, display devices according to the present disclosure are not limited thereto, and may include various types of display devices.

FIG. 1 is a schematic plan view of a display device 1 according to an embodiment.

Referring to FIG. 1, the display device 1 may include a display 40 disposed on a substrate 100. The display 40 may include pixels P connected to scan lines SL extending in an x-direction and data lines DL extending in a y-direction crossing the scan lines SL. The display 40 may provide a certain image via light emitted from the pixels P and define a display area DA. Each pixel P may emit, for example, red, green, or blue light. Alternatively, each pixel P may emit red, green, blue, or white light. Each pixel P may include a display element, such as an organic light-emitting diode OLED.

A peripheral area PA may be outside the display area DA. The peripheral area PA may surround the display area DA. The peripheral area PA may be an area in which the pixels P are not disposed and may correspond to a non-display area not providing an image. Although not shown, a scan driver providing a scan signal to the scan lines SL and a data driver providing a data signal to the data lines DL may be disposed in the peripheral area PA.

A first power supply line 10 and a second power supply line 20 may be disposed in the peripheral area PA. The first power supply line 10 may be disposed to correspond to a first side E1 of the display area DA and the second power supply line 20 may be disposed to correspond to second through fourth sides E2, E3, and E4 of the display area DA. FIG. 1 illustrates that the first power supply line 10 is disposed between the first side E1 of the display area DA and a pad portion 30, and the second power supply line 20 may have a loop shape with one open side corresponding to the first side E1, and may partially surround the display area DA.

The first power supply line 10 may include a first body portion 11 extending along the first side E1 of the display area DA. The first body portion 11 may extend in the x direction along the first side E1 of the display area DA and may have a length that is equal to or greater than a length of the first side E1 of the display area DA.

The first body portion 11 may be integrally formed with a first connection portion 12 extending in the y direction from the first body portion 11. The first connection portion 12 may extend in the y direction toward the pad portion 30 in a pull-off area (leading-in area) POA. Here, the leading-in area POA may be, for example, an area ranging from the first side E1 of the display area DA adjacent to the pad portion 30 to a side of the substrate 100. The leading-in area POA may be understood as an area from the first side E1 of the display area DA to the pad portion 30. The first connection portion 12 may extend from the first body portion 11 toward an edge of the substrate 100 and may be connected to a first terminal 31 of the pad portion 30.

The second power supply line 20 may include a second body portion 21 extending along the second through fourth sides E2, E3, and E4 of the display area DA. The second body portion 21 may partially surround the display area DA along the second through fourth sides E2, E3, and E4 of the display area DA except for the first side E1 of the display area DA. The second side E2 may be located at a side opposite to the first side E1, and the third and fourth sides E3 and E4 may connect the first side E1 with the second side E2 and may be located at sides opposite to each other. The second body portion 21 may partially surround the display area DA and both ends of the first body portion 11.

The second body portion 21 may be integrally formed with a second connection portion 22 extending in the y direction from the second body portion 21. The second connection portion 22 may extend in the y direction toward the pad portion 30 in the leading-in area POA. The second connection portion 22 may extend in the leading-in area POA in parallel to the first connection portion 12 and may be connected to a second terminal 32 of the pad portion 30.

The pad portion 30 may correspond to an end of the substrate 100. The pad portion 30 may not be covered by an insulating layer, etc., and may be exposed so as to be connected with a controller (not shown) through a flexible printed circuit board, etc. Signals or power supply from the controller may be provided to display elements via the pad portion 30.

The first power supply line 10 may provide a first power voltage ELVDD (refer to FIG. 2) to each pixel P, and the second power supply line 20 may provide a second power voltage ELVSS (refer to FIG. 2) to each pixel P. The first power voltage ELVDD may be provided to each pixel P via a driving voltage line PL connected to the first power supply line 10. The second power voltage ELVSS may be provided to an opposite electrode (for example, a cathode) of the organic light-emitting diode OLED. Here, the second body portion 21 of the second power supply line 20 and the opposite electrode of the organic light-emitting diode OLED may be connected to each other in the peripheral area PA so that the second power voltage ELVSS is transmitted to the opposite electrode of the organic light-emitting diode OLED. FIG. 1 illustrates one driving voltage line PL. However, a plurality of driving voltage lines PL may be disposed in the display area DA.

Figure 2:
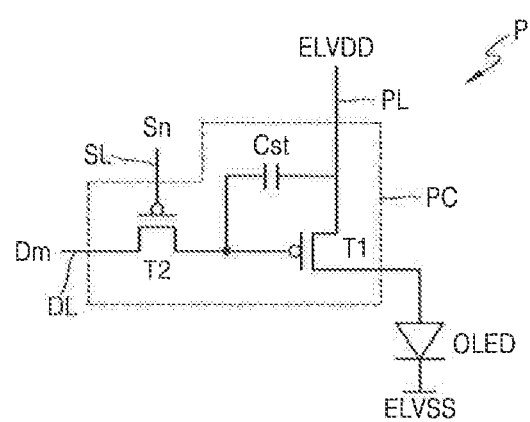
FIG. 2 illustrates an equivalent circuit of any one pixel of a display device, according to an embodiment.

FIG. 2 illustrates an equivalent circuit of any one pixel P of a display device according to an embodiment.

Referring to FIG. 2, the pixel P may include a pixel circuit PC connected to the scan lines SL, the data lines DL, and the driving voltage line PL, and the organic light-emitting diode OLED connected to the pixel circuit PC.

The pixel circuit PC may include a driving thin film transistor T1, a switching thin film transistor T2, and a storage capacitor Cst. The switching thin film transistor T2 may be connected to the scan lines SL and the data lines DL and may transmit a data signal Dm provided via the data lines DL to the driving thin film transistor T1 based on a scan signal Sn provided via the scan lines SL.

The storage capacitor Cst may be connected to the switching thin film transistor T2 and the driving voltage line PL, and may store a voltage corresponding to a difference between a voltage received from the switching thin film transistor T2 and the first power voltage ELVDD (or a driving voltage) supplied via the driving voltage line PL.

The driving thin film transistor T1 may be connected to the driving voltage line PL and the storage capacitor Cst, and may control a driving current flowing through the organic light-emitting diode OLED from the driving voltage line PL based on the voltage stored in the storage capacitor Cst. The organic light-emitting diode OLED may emit light having a certain brightness based on the driving current.

FIG. 2 illustrates a case in which the pixel circuit PC includes two thin film transistors and one storage capacitor. However, the present disclosure is not limited thereto. According to another embodiment, the pixel circuit PC may include three or more thin film transistors and/or two or more storage capacitors. As such, according to the present disclosure, the number of thin film transistors and the number of storage capacitors may be variously modified according to a design of the pixel circuit PC.

Figure 3:
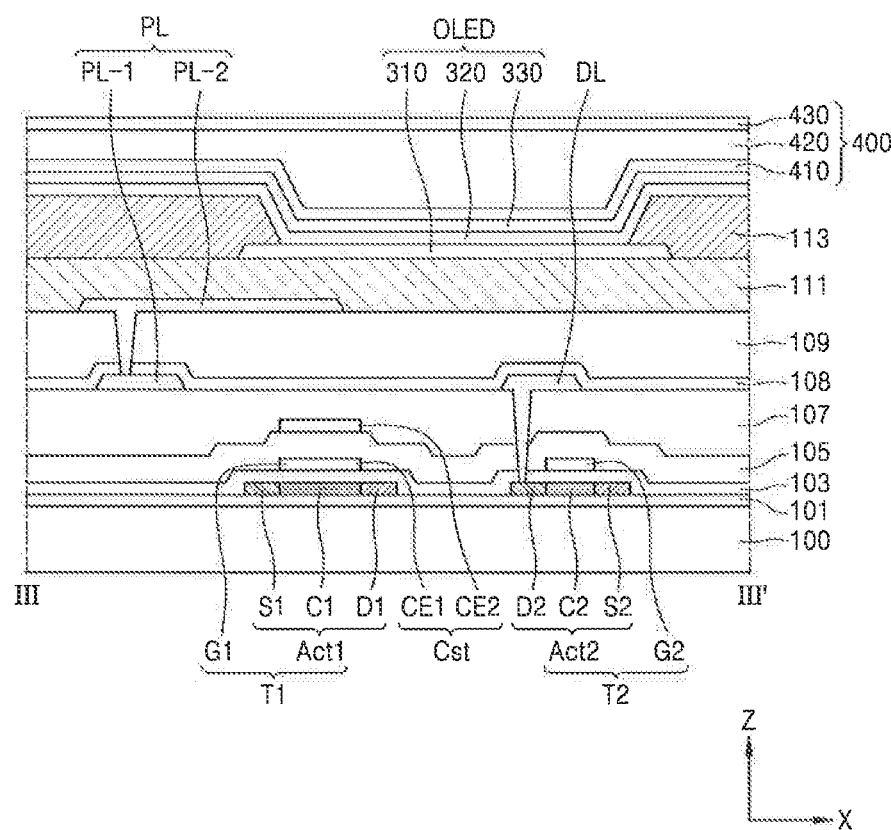
FIG. 3 is a cross-sectional view of a display device according to an embodiment, the cross-sectional view illustrating a section taken along a line III-III' of FIG. 1.

FIG. 3 is a cross-sectional view of a display device according to an embodiment, the cross-sectional view illustrating a section taken along a line III-III' of FIG. 1.

Referring to FIG. 3, the substrate 100 may include a glass material or a polymer resin. The polymer resin may include, for example, polyethersulphone (PES), polyacrylate (PAR), polyetherimide (PEI), polyethylene naphthalate (PEN), polyethylene terephthalate (PET), polyphenylene sulfide (PPS), polyaryllate, polyimide (PI), polycarbonate (PC), or cellulose acetate propionate (CAP). The substrate 100 may be a single layer or multiple layers including the materials described above. When the substrate 100 includes multiple layers, the substrate 100 may further include a layer (not shown) including an inorganic insulating material. The substrate 100 may have a flexible, rollable, or bendable characteristic.

A buffer layer 101 may be disposed on the substrate 100 and may prevent impurities from penetrating into the substrate 100. The buffer layer 101 may include silicon oxide (SiOx) and/or silicon nitride (SiNx).

The driving thin film transistor T1 may include a driving semiconductor layer Act1 and a driving gate electrode G1, and the switching thin film transistor T2 may include a switching semiconductor layer Act2 and a switching gate electrode G2. A first gate insulating layer 103 may be disposed between the driving semiconductor layer Act1 and the driving gate electrode G1 and between the switching semiconductor layer Act2 and the switching gate electrode G2. The first gate insulating layer 103 may include an inorganic insulating material, such as SiOx, SiNx, silicon oxynitride (SiON), etc., and may be formed as a single layer or multiple layers.

The driving semiconductor layer Act1 and the switching semiconductor layer Act2 may include polysilicon. The driving semiconductor layer Act1 may include a driving channel area C1 overlapping the driving gate electrode G1 and not doped with impurities, and a driving source area S1 and a driving drain area D1 respectively at opposite sides of the driving channel area C1, which are doped with impurities. The switching semiconductor layer Act2 may include a switching channel area C2 overlapping the switching gate electrode G2 and not doped with impurities, and a switching source area S2 and a switching drain area D2 respectively at opposite sides of the switching channel area C2, which are doped with impurities. The present disclosure is not limited to the case in which the driving semiconductor layer Act1 and the switching semiconductor layer Act2 include polysilicon as described above. According to another embodiment, the driving semiconductor layer Act1 and the switching semiconductor layer Act2 may include an oxide semiconductor, an organic semiconductor, etc.

The driving and switching gate electrodes G1 and G2 may be disposed on the first gate insulating layer 103 to overlap the driving and switching channel areas C1 and C2. The driving and switching gate electrodes G1 and G2 may include Mo, Al, Cu, Ti, etc., and may include a single layer or multiple layers. For example, the driving and switching gate electrodes G1 and G2 may be single layers including Mo.

In this specification, the source area and the drain area of the thin film transistor may be understood as a source electrode and a drain electrode of the thin film transistor, respectively. For example, the driving source area S1 and the driving drain area D1 may be understood as a driving source electrode and a driving drain electrode, respectively, and the switching source area S2 and the switching drain area D2 may be understood as a switching source electrode and a switching drain electrode, respectively. Hereinafter, for convenience of explanation, the terms, the source area and the drain area, will be used rather than the source electrode and the drain electrode.

According to an embodiment, the storage capacitor Cst may be disposed to overlap the driving thin film transistor T1. In this case, areas of the storage capacitor Cst and the driving thin film transistor T1 may be increased, and a high quality image may be provided. For example, the driving gate electrode G1 may be a first storage capacitor plate CE1 of the storage capacitor Cst and a second storage capacitor plate CE2 may overlap the first storage capacitor plate CE1 with a second gate insulating layer 105 between the first storage capacitor plate CE1 and the second storage capacitor plate CE2. The second gate insulating layer 105 may include SiOx, SiNx, SiON, etc., and may be a single layer or multiple layers including the materials described above.

The driving and switching thin film transistors T1 and T2, and the storage capacitor Cst may be covered by an interlayer insulating layer 107. The interlayer insulating layer 107 may include an inorganic material, such as SiON, SiOx, and/or SiNx. The data lines DL may be disposed on the interlayer insulating layer 107, and the data lines DL may be connected to the switching semiconductor layer Act2 of the switching thin film transistor T2 via a contact hole penetrating the interlayer insulating layer 107. FIG. 3 illustrates that the data lines DL connected to the switching drain area D2, and a portion of the data lines DL may be understood as a switching drain electrode.

The driving voltage line PL may be disposed on the interlayer insulating layer 107. The driving voltage line PL may include a lower driving voltage line PL-1 and an upper driving voltage line PL-2. It is desired to prevent voltage drop, etc. in the driving voltage line PL to realize a display device providing a high-quality image. According to an embodiment, since the lower driving voltage line PL-1 and the upper driving voltage line PL-2 are electrically connected to each other with the interlayer insulating layer 107 therebetween, an increase in the resistance of the driving voltage line PL may be prevented, and the voltage drop that may be caused by the resistance of the driving voltage line PL may be prevented.

The lower driving voltage line PL-1 may include the same material as the data lines DL. For example, the lower driving voltage line PL-1 may include Mo, Al, Cu, Ti, etc., and may be formed as a single layer or multiple layers. In some embodiments, the lower driving voltage line PL-1 may have a multi-layer structure including Ti/Al/Ti.

The lower driving voltage line PL-1 and the upper driving voltage line PL-2 may be connected to each other via a contact hole defined by a first insulating layer 109 between the lower driving voltage line PL-1 and the upper driving voltage line PL-2. The driving voltage line PL may be covered by a second insulating layer 111, which is a panarization insulating layer. The upper driving voltage line PL-2 may include Mo, Al, Cu, Ti, etc., and may be formed as a single layer or multiple layers. In some embodiments, the upper driving voltage line PL-2 may have a multi-layer structure including Ti/Al/Ti.

The lower driving voltage line PL-1 and the data lines DL may be covered by an inorganic insulating layer 108. The inorganic insulating layer 108 may protect the lower driving voltage line PL-1 and the data lines DL illustrated in FIG. 3, and/or various voltage lines and wires provided in the peripheral area PA described above with reference to FIG. 1, thereby preventing damage to the voltage lines and the wires in a manufacturing process of a display device, for example, an etching process, etc.

The first insulating layer 109 may include an organic material. The first insulating layer 109 may include an organic insulating material, such as a general-purpose polymer, such as an imide-based polymer, polymethylmethacrylate (PMMA), polystyrene (PS), etc., polymer derivatives having a phenol-based group, an acryl-based polymer, an aryl ether-based polymer, an amide-based polymer, a fluorine-based polymer, a p-xylene-based polymer, a vinyl alcohol-based polymer, and a blend thereof.

The second insulating layer 111 may cover the data lines DL and the driving voltage line PL. The second insulating layer 111 may be an insulating layer including an organic insulating material and may provide a flat surface on which a pixel electrode 310 may be disposed. The organic material may include a general-purpose polymer, such as an imide-based polymer, PMMA, PS, etc., polymer derivatives having a phenol-based group, an acryl-based polymer, an aryl ether-based polymer, an amide-based polymer, a fluoro-based polymer, a p-xylene-based polymer, a vinyl alcohol-based polymer, and a blend thereof.

The organic light-emitting diode OLED may be located on the second insulating layer 111. The organic light-emitting diode OLED includes the pixel electrode 310, an opposite electrode 330, and an intermediate layer 320 therebetween. The Intermediate layer 320 includes an emission layer.

The pixel electrode 310 may be disposed on the second insulating layer 111. Although not shown in FIG. 3, the pixel electrode 310 may be electrically connected to the pixel circuits below the second insulating layer 111, for example, the driving and switching thin film transistors T1 and T2, via a contact hole formed in the second insulating layer 111.

The pixel electrode 310 may be exposed via an opening of a pixel-defining layer 113. The pixel-defining layer 113 may define the pixel by having an opening exposing the pixel electrode 310. The pixel-defining layer 113 may cover an edge of the pixel electrode 310 and increase a distance between the pixel electrode 310 and the opposite electrode 330, thereby preventing arc occurrence, etc. between the pixel electrode 310 and the opposite electrode 330. The pixel-defining layer 113 may include an organic material, such as PI or hexamethyldisiloxane (HMDSO).

The intermediate layer 320 may include a low molecular weight material or a high molecular weight material. In an embodiment, where the intermediate layer 320 includes a low-molecular weight material, the intermediate layer 320 may have a single-layer or multi-layer structure including a hole injection layer ("HIL"), a hole transport layer ("HTL"), an emission layer ("EML") an electron transport layer ("ETL"), an electron injection layer ("EIL"), etc., and may include at least one of various organic materials including copper phthalocyanine ("CuPc"), N,N'-Di(naphthalene-1-yl)-N,N'-diphenyl-benzidine ("NPB"), tris-8-hydroxyquinoline aluminum ("Alq$_3$"), and the like.

In an embodiment, where the intermediate layer 320 includes a high molecular weight material, the intermediate layer 320 may usually have a structure including an HTL and an EML. In such an embodiment, the HTL may include PEDOT, and the EML may include a high-molecular material such as a poly-phenylenevinylene ("PPV")-based polymer or a polyfluorene-based polymer. The structure of the intermediate layer 320 is not limited thereto and may vary. In one embodiment, for example, at least one of layers of the intermediate layer 320 may be integrally formed as a single unitary unit and disposed over multiple pixel electrodes 310. Alternatively, the intermediate layer 320 may include a layer patterned to correspond to each of the pixel electrodes 310.

The opposite electrode 330 may be disposed on the Intermediate layer 320 and may cover all of the display area DA (refer to FIG. 1). The opposite electrode 330 may be integrally formed as a single unitary unit.

A thin film encapsulation layer 400 may cover all of the display 40 (refer to FIG. 1) including the organic light-emitting diodes OLEDs. The thin film encapsulation layer 400 may prevent display elements, such as the organic light-emitting diodes OLEDs, from being damaged due to external moisture or oxygen. The thin film encapsulation layer 400 may include at least one organic encapsulation layer and at least one inorganic encapsulation layer, and FIG. 3 illustrates that the thin film encapsulation layer 400 includes a first inorganic encapsulation layer 410, an organic encapsulation layer 420, and a second inorganic encapsulation layer 430.

The first inorganic encapsulation layer 410 may cover the opposite electrode 330, and may include SiOx, SiNx, and/or SiON. Although not shown, other layers, such as a capping layer, etc., may be between the first inorganic encapsulation layer 410 and the opposite electrode 330, according to necessity. When the capping layer is not formed, the first inorganic encapsulation layer 410 may include at least two SiON layers having different properties.

The organic encapsulation layer 420 may include at least one material selected from the group consisting of an acryl-based resin, a methacryl-based resin, polyisoprene, a vinyl-based resin, an expoxy-based resin, a urethane-based resin, a cellulose-based resin, a perylene-based resin.

The second inorganic encapsulation layer 430 may cover the organic encapsulation layer 420 and may include SiOx, SiNx, and/or SiON.

The first and second inorganic encapsulation layers 410 and 430 may be formed by using a chemical vapor deposition (CVD) method, and the organic encapsulation layer 420 may be formed by coating an organic material in a liquid form on the substrate 100 and curing the liquid organic material. A dam 210 to be described below with reference to FIG. 4 may be provided in the peripheral area PA, so that the organic material spread in the liquid form does not flow toward the edge of the substrate 100 and into the pad portion 30 (refer to FIG. 1).

Figure 4:
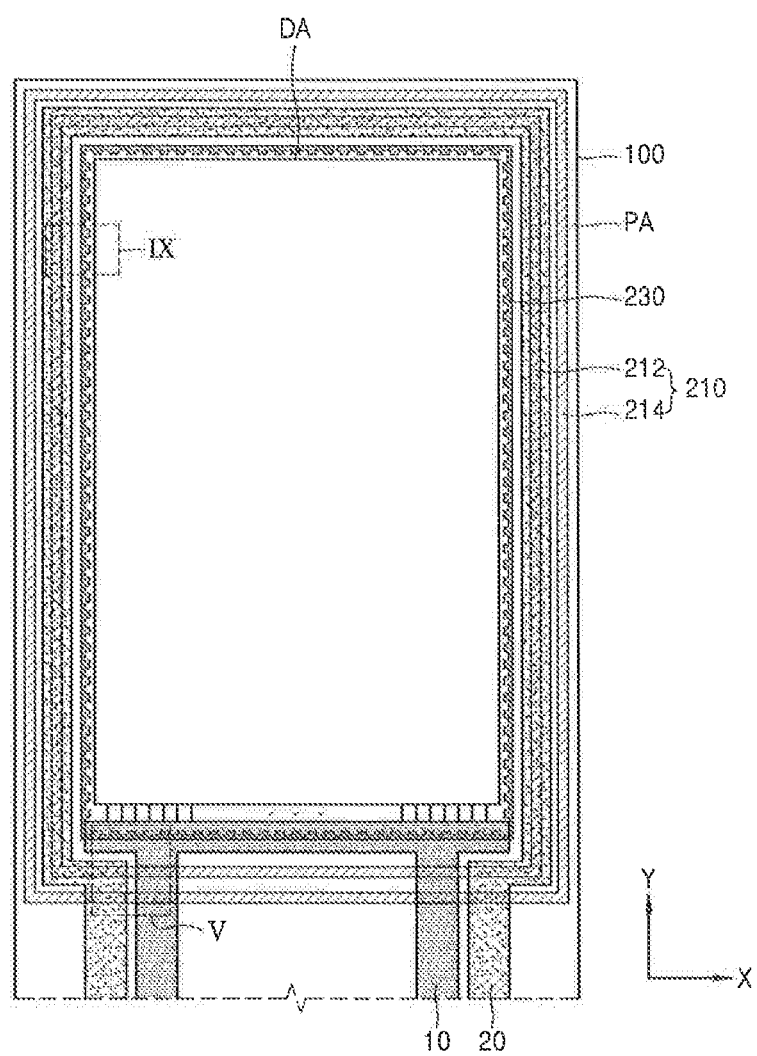
FIG. 4 is a plan view of portions of a display device, the portions being around power supply lines, according to an embodiment.

FIG. 4 is a plan view showing portions of a display device, the portions being around the first and second power supply lines 10 and 20, according to an embodiment.

Referring to FIG. 4, the dam 210 may have a ring shape surrounding the display area DA and may be disposed in the peripheral area PA. FIG. 4 illustrates that the dam 210 includes a first dam 212 and a second dam 214 surrounding the first dam 212. As described above, the dam 210 may prevent the liquid organic material for forming the organic encapsulation layer 420 of the thin film encapsulation layer 400 from flowing toward the edge of the substrate 100.

As an area of the peripheral area PA decreases, a distance between the first dam 212 and the second dam 214 decreases. Thus, in order to prevent the difficulty in controlling the flow of the liquid organic material for forming the organic encapsulation layer 420, a barrier layer 230 may be disposed between the display area DA and the dam 210. The barrier layer 230 may form a step difference with respect to a layer below the barrier layer 230 and have a certain pattern, and may suppress or delay the flow of the liquid organic material. The barrier layer 230 may have a zigzag pattern or a concavo-convex pattern when viewed a direction (on a plane) perpendicular to a main surface of the substrate 100.

Figure 5:
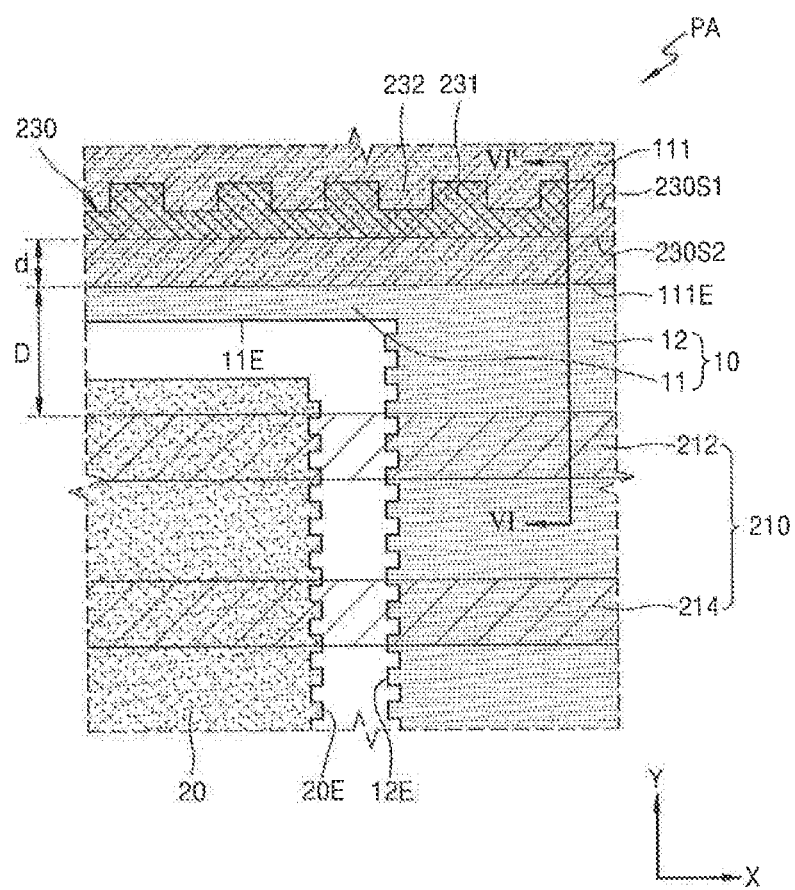
FIG. 5 is a plan view of a portion V of FIG. 4.
Figure 6:
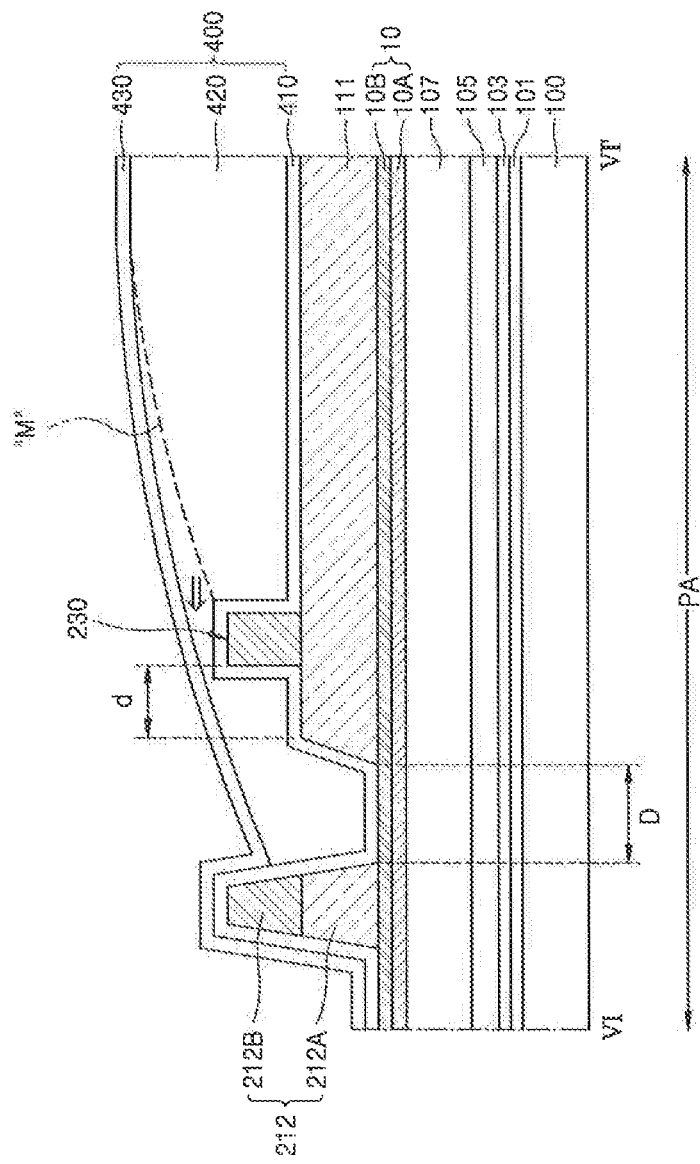
FIG. 6 is a cross-sectional view of the portion V of FIG. 4, taken along a line VI-VI' of FIG. 5.

FIG. 5 is a plan view of a portion V of FIG. 4, FIG. 6 is a cross-sectional view of the portion V of FIG. 4, taken along a line VI-VI' of FIG. 5, and FIG. 7 is a perspective cross-sectional view of the first dam 212, the barrier layer 230, and portions around the first dam 212 and the barrier layer 230 of a display device according to an embodiment. In FIG. 7, for convenience of explanation, components provided above the first dam 212 and the barrier layer 230 will not be illustrated.

Referring to FIG. 5, the first power supply line 10 including the first body portion 11 extending in a first direction (in an x direction in FIG. 5) and the first connection portion 12 extending in a second direction (in a y direction in FIG. 5) crossing the first body portion 11 may be located in the peripheral area PA. The second power supply line 20 may be located adjacent to the first power supply line 10.

The first power supply line 10 may include multiple layers. According to an embodiment, the first power supply line 10 may include a first layer 10A and a second layer 10B, which are stacked, as illustrated in FIG. 6. The first layer 10A may be formed together with the data lines DL and/or the lower driving voltage line PL-1 described with reference to FIG. 3 by using the same process so as to include the same material as the data lines DL and/or the lower driving voltage line PL-1, and the second layer 10B may be formed together with the upper driving voltage line PL-2 described with reference to FIG. 3 by using the same process so as to include the same material as the upper driving voltage line PL-2.

FIG. 6 illustrates that both of portions of the first power supply line 10, the portions corresponding to the first body portion 11 and the first connection portion 12, respectively, include the first layer 10A and the second layer 10B, which are stacked. However, the present disclosure is not limited thereto. According to another embodiment, a portion of the first power supply line 10, which corresponds to the first body portion 11, may have a structure in which the first layer 10A and the second layer 10B are stacked as described above, while the other portion of the first power supply line 10, which corresponds to the first connection portion 12, may be a single first layer 10A. As the first power supply line 10, the second power supply line 20 may include a plurality of layers. At least a portion of the second power supply line 20 includes a plurality of layers which overlap each other.

The first power supply line 10 may be partially covered by an insulating layer. FIGS. 5 and 6 illustrate that the second insulating layer 111 described above with reference to FIGS. 2 and 3 extends onto the first power supply line 10 and partially covers the first power supply line 10. The second insulating layer 111 may extend to the peripheral area PA beyond the display area DA (refer to FIG. 1) and may partially cover the first power supply line 10. An end 111E of the second insulating layer 111 may be located inside the dam 210 while being spaced apart from the dam 210 by a certain distance. FIGS. 5 and 6 illustrate that the end 111E of the second insulating layer 111 is located on the first body portion 11 of the first power supply line 10.

The dam 210 may be disposed outside the second insulating layer 111. The first dam 212 may surround all of the display area DA while being spaced apart from the end 111E of the second insulating layer 111 by a first distance D. The second dam 214 may surround all of the display area DA while being spaced apart from the end 111E of the second insulating layer 111 by a distance greater than the first distance D.

Referring to FIGS. 6 and 7, a liquid organic material M coated on the substrate 100 to form the organic encapsulation layer 420 of the thin film encapsulation layer 400 may flow in a first direction and a second direction. In this specification, the first direction may be understood as a direction which is parallel to an edge (sides) of the display area DA (refer to FIGS. 1 and 4) and the second direction may be understood as a direction crossing the first direction and the direction toward an edge of the substrate 100 from the display area DA (refer to FIGS. 1 and 4). In order to suppress or delay the flow of the liquid organic material M in the first direction and the second direction, the barrier layer 230 having a zigzag surface or concavo-convex surface may be formed on the second insulating layer 111. Furthermore, side edges of the first and second power supply lines 10 and 20 may be formed to have a concavo-convex shape.

The barrier layer 230 may be disposed on the second insulating layer 111 to form a step difference with respect to an upper surface of the second insulating layer 111. The barrier layer 230 may include a first side surface 230S1 facing the display area DA and a second side surface 230S2 at a side opposite to the first side surface 230S1, wherein at least one of the first side surface 230S1 and the second side surface 230S2 may include a zigzag or concavo-convex surface. FIGS. 5 through 7 illustrate that the first side surface 230S1 of the barrier layer 230 includes the concavo-convex surface, and thus, the barrier layer 230 may have a structure in which a convex portion 231 and a concave portion 232 are alternately provided.

The liquid organic material M for forming the organic encapsulation layer 420 may flow while contacting surfaces forming a step difference between the second insulating layer 111 and the barrier layer 230. For example, the liquid organic material M may flow while contacting the upper surface of the second insulating layer 111 and the first side surface 230S1 of the barrier layer 230. Here, as illustrated in FIG. 7, the liquid organic material M may flow in the first direction along the concavo-convex surface of the first side surface 230S1 of the barrier layer 230 and the flow thereof may be suppressed or delayed via the zigzag surface.

The barrier layer 230 may be disposed to overlap the first body portion 11 of the first power supply line 10, as illustrated in FIG. 5. For example, the barrier layer 230 may overlap the first body portion 11 and may be located inside an end 11E of the first body portion 11. As described above, the liquid organic material M may easily flow along the structure having the step difference wherein the step difference may be formed between the second insulating layer 111 and the barrier layer 230 formed in the first direction (the x direction in FIG. 5), and between an end edge 12E of the first connection portion 12 and a layer (for example, the interlayer insulating layer 107 of FIG. 6) below the end edge 12E of the first connection portion 12 formed in the second direction (the y direction in FIG. 5). A margin (for example, a distance between the first side E1 of the display area DA and the edge of the substrate 100) of the peripheral area PA in the second direction is much less than a margin (for example, a distance surrounding the display area DA) of the peripheral area PA in the first direction, and thus, the barrier layer 230 having the concavo-convex surface in the first direction may be disposed to overlap the first body portion 11 extending in the first direction. Accordingly, the flow of the liquid organic material M may be sufficiently delayed before the liquid organic material M flows in the second direction via the first connection portion 12 extending in the second direction.

The barrier layer 230 may be disposed inside the end 111E of the second insulating layer 111. In other words, the second insulating layer 111 may extend toward the edge of the substrate 100 further than the barrier layer 230 by a second distance "d." As such, a step difference may further be formed between the second side surface 230S2 of the barrier layer 230 and the upper surface of the second insulating layer 111 so that the flow of the liquid organic material M may further be delayed. The flow of the liquid organic material M may further be suppressed or delayed when the second side surface 230S2 of the barrier layer 230 includes a zigzag or concavo-convex surface.

The barrier layer 230 may include the same material as the pixel-defining layer 113. For example, the barrier layer 230 may be formed together with the pixel-defining layer 113 by using the same process. As illustrated in FIG. 7, the pixel-defining layer 113 may extend to the peripheral area PA beyond the display area DA, while an outer end edge 113E of the pixel-defining layer 113 may be located inside the first side surface 230S1 of the barrier layer 230 so that the barrier layer 230 and the pixel-defining layer 113 may be spaced apart from each other.

The liquid organic material M, the flow of which is delayed by the barrier layer 230, may slowly flow toward the first dam 212 by passing through the barrier layer 230 and may form the organic encapsulation layer 420. Here, in order to delay the flow of the liquid organic material M proceeding in the second direction, a portion of an edge of the first power supply line 10, for example, the end edge 12E of the first connection portion 12, may include a concavo-convex structure, as illustrated in FIG. 5. Likewise, an end edge 20E of the second power supply line 20 may be patterned to be concavo-convex.

The organic encapsulation layer 420 formed by the liquid organic material M, the flow of which is delayed by the concavo-convex structures of the barrier layer 230 and the end edges 12E and 20E of the first and second power supply lines 10 and 20, may be located at an inner portion of the dam 210 while covering the barrier layer 230. FIG. 6 illustrates that an edge of the organic encapsulation layer 420 corresponds to an inner side surface of the first dam 212.

The first dam 212 may include a plurality of layers including a first dam layer 212A and a second dam layer 212B, as illustrated in FIG. 6. According to an embodiment, the first dam layer 212A may include the same material as the second insulating layer 111 and the second dam layer 212B may include the same material as the barrier layer 230.

The barrier layer 230 may include the same material as the pixel-defining layer 113 and may be formed by using the same process as the pixel-defining layer 113, described with reference to FIG. 3. The barrier layer 230 may be disposed apart from the pixel-defining layer 113 as illustrated in FIG. 7. FIG. 7 illustrates that the pixel-defining layer 113 extends beyond the display area DA to cover a portion of the first power supply line 10 in the peripheral area PA. However, the present disclosure is not limited thereto. According to another embodiment, the outer end edge 113E of the pixel-defining layer 113 may not cover the first power supply line 10 while being spaced apart from the barrier layer 230. As such, specific locations of the pixel-defining layer 113 may vary.

Figure 8A:
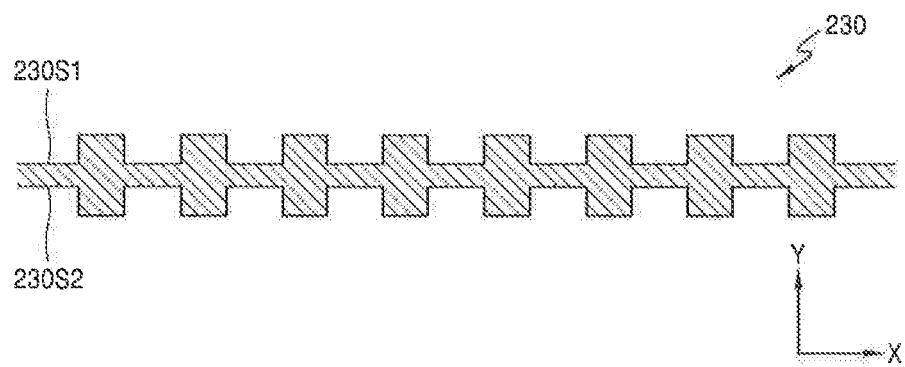
FIGS. 8A through 8C are schematic plan views of a barrier layer, according to embodiments.
Figure 8B:
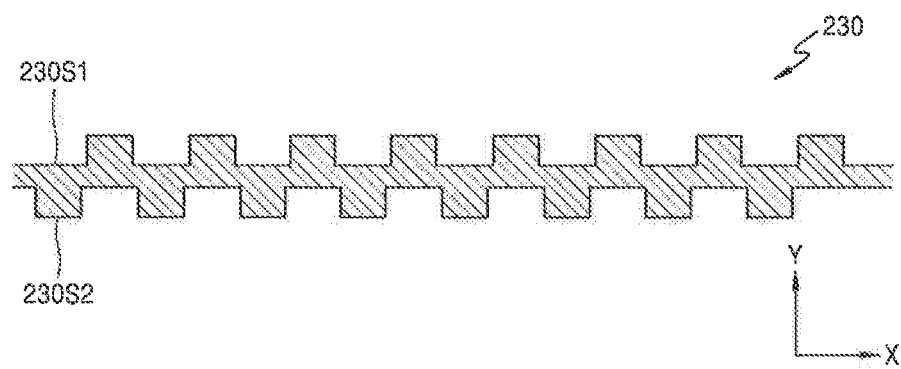
Figure 8C:
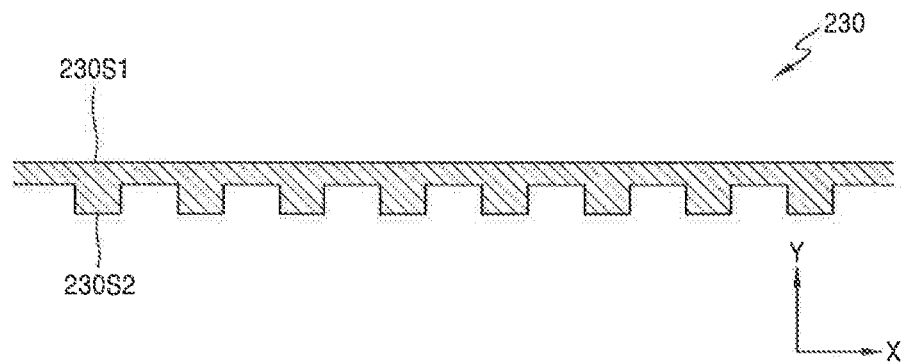

FIGS. 8A through 8C are schematic plan views of the barrier layer 230, according to embodiments.

Referring to FIGS. 8A and 8B, both the first side surface 230S1 and the second side surface 230S2 of the barrier layer 230 may include a zigzag or concavo-convex surface, and specific shapes thereof may be variously modified. For example, a convex region of the first side surface 230S1 and a convex region of the second side surface 230S2 may be adjacent to each other (FIG. 8), or the convex region of the first side surface 230S1 and a concave region of the second side surface 230S2 may be adjacent to each other (FIG. 8B). According to another embodiment, as illustrated in FIG. 8C, only the second side surface 230S2 of the first side surface 230S1 and the second side surface 230S2 of the barrier layer 230 may include a zigzag or concavo-convex surface.

According to the embodiments described above, it is illustrated that the zigzag or concavo-convex surfaces of the barrier layer 230 include squares based on a direction (on a plane) perpendicular to the substrate 100. However, the present disclosure is not limited thereto. Shapes of the zigzag or concavo-convex surface of the barrier layer 230 may be variously modified. For example, the zigzag or concavo-convex surface may have a polygonal shape, such as a triangular shape, etc., or a round shape, such as a semi-circular shape, etc., when viewed in the direction perpendicular to the main surface of substrate 100.

Figure 9:
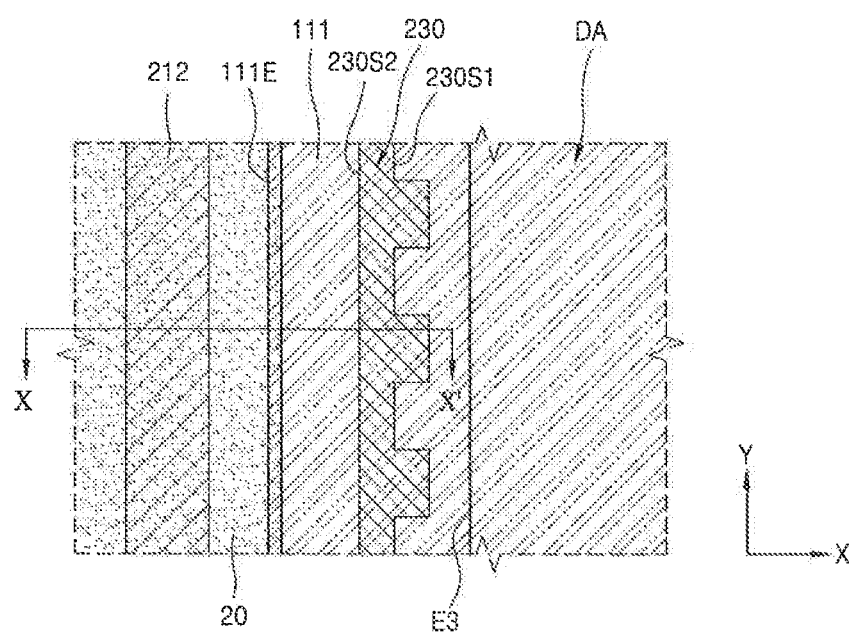
FIG. 9 is a plan view of a portion IX of FIG. 4.
Figure 10:
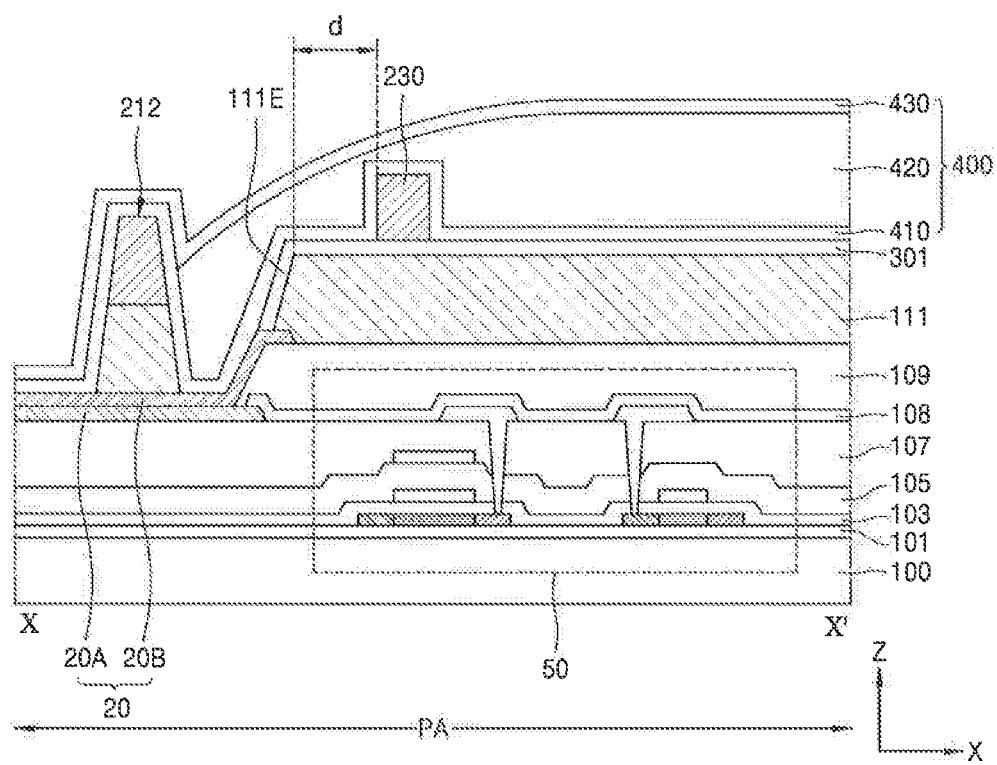
FIG. 10 is a cross-sectional view of the portion IX of FIG. 4, taken along a line X-X' of FIG. 9.

FIG. 9 is a plan view of a portion IX of FIG. 4 and FIG. 10 is a cross-sectional view of the portion IX of FIG. 4, taken along a line X-X' of FIG. 9.

The barrier layer 230 may be disposed to generally surround the display area DA as illustrated in FIG. 4 and may control the flow of the liquid organic material M. FIG. 9 illustrates that the barrier layer 230 is disposed adjacent to the third side E3 of the display area DA. The barrier layer 230 may be disposed on the second insulating layer 111 while forming a step difference with respect to the second insulating layer 111 as illustrated in FIG. 10. The characteristic that the second insulating layer 111 extends toward the edge of the substrate 100 beyond the barrier layer 230 by the second distance "d" and includes the zigzag or concavo-convex surface is described above with reference to FIGS. 5 through 7, and thus, it will not be repeatedly described.

Referring to FIG. 10, a portion of the barrier layer 230, the portion being disposed adjacent to the third side E3 of the display area DA, may overlap a driving circuit portion 50 provided therebelow. The driving circuit portion 50 may be a scan driver, etc., connected with the scan lines SL and providing a scan signal to the scan lines SL.

The dam 210 may be disposed to generally surround the display area DA, as illustrated in FIG. 4, and may control the flow of the liquid organic material M. FIGS. 9 and 10 illustrate the first dam 212. The first dam 212 may be disposed to overlap the second power supply line 20 around the third side E3 of the display area DA.

The second power supply line 20 may be disposed adjacent to the third side E3 of the display area DA, and the second power supply line 20 may have a structure in which a first layer 20A and a second layer 20B are stacked as illustrated in FIG. 10. The second power supply line 20 may be connected to the opposite electrode 330 (refer to FIG. 3) of the organic light-emitting diode OLED via a connection electrode layer 301 between the second insulating layer 111 and the barrier layer 230.

Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

EXPLANATION OF REFERENCE NUMERALS DESIGNATING THE MAJOR ELEMENTS OF THE DRAWINGS

100: substrate
109: first insulating layer
111: second insulating layer
113: pixel-defining layer
212: first dam
214: second dam
230: barrier layer
230S1: first side surface of barrier layer
230S2: second side surface of barrier layer
400: thin film encapsulation layer
410: first inorganic encapsulation layer
420: organic encapsulation layer
430: second inorganic encapsulation layer

What is claimed is:

1. A display device comprising:
   a substrate including a display area and a peripheral area adjacent to the display area;
   a display element disposed in the display area and electrically connected to a thin film transistor;
   a power supply line disposed in the peripheral area;
   an insulating layer covering a portion of the power supply line; and
   a barrier layer disposed on the insulating layer and including a first side surface facing the display area and a second side surface facing away from the display area, wherein at least one of the first side surface or the second side surface comprises a concavo-convex surface,
   wherein the barrier layer forms a step difference with respect to an upper surface of the insulating layer facing away from the substrate, and
   an end of the insulating layer is positioned beyond the second side surface of the barrier layer on a side of the barrier layer facing away from the display area.

2. The display device of claim 1, further comprising:
   a planarization layer between the thin film transistor and the display element; and a pixel-defining layer disposed on a pixel electrode of the display element and defining an opening exposing the pixel electrode.

3. The display device of claim 2, wherein the insulating layer comprises a same material as the planarization layer, and the barrier layer comprises a same material as the pixel-defining layer.

4. The display device of claim 2, wherein the barrier layer is spaced apart from the pixel-defining layer by a predetermined distance.

5. The display device of claim 1, wherein the power supply line comprises a body portion extending along an edge of the display area and a connection portion extending from the body portion toward an outer edge of the substrate so as to cross the body portion, and the barrier layer overlaps the body portion of the power supply line along a direction orthogonal to an upper surface of the substrate.

6. The display device of claim 5, wherein the connection portion comprises a concavo-convex surface.

7. The display device of claim 1, further comprising:
a terminal disposed in the peripheral area adjacent to a first side of the display area,
wherein the power supply line is disposed between the first side of the display area and the terminal.

8. The display device of claim 7, wherein the barrier layer extends to surround the display area when viewed in a plan view.

9. The display device of claim 1, further comprising:
a dam surrounding the display area in a plan view.

10. The display device of claim 9, wherein the barrier layer is between an edge of the display area facing the peripheral area and the dam.

11. A display device comprising:
a substrate including a display area and a peripheral area adjacent to the display area;
a thin film transistor disposed in the display area;
a pixel electrode electrically connected to the thin film transistor;
an insulating layer between the thin film transistor and the pixel electrode;
a power supply line disposed in the peripheral area, wherein a portion of the power supply line is covered by the insulating layer; and
a barrier layer disposed in the peripheral area to overlap the power supply line along a direction orthogonal to an upper surface of the substrate, the barrier layer including a first side surface facing the display area and a second side surface facing away from the display area, wherein at least one of the first side surface or the second side surface comprises a concavo-convex surface, wherein the barrier layer forms a step difference with respect to an upper surface of the insulating layer facing away from the upper surface of the substrate.

12. The display device of claim 11, further comprising:
a pixel-defining layer defining an opening exposing the pixel electrode;
an emission layer overlapping the pixel electrode through the opening of the pixel-defining layer; and
an opposite electrode on the emission layer.

13. The display device of claim 12, wherein the barrier layer is spaced apart from the pixel-defining layer by a predetermined distance.

14. The display device of claim 11, wherein an end of the insulating layer is positioned beyond the second side surface of the barrier layer on a side of the barrier layer facing away from the display area.

15. The display device of claim 11, wherein the power supply line comprises a main power supply line portion extending along a first side of the display area, and the barrier layer overlaps the main power supply line portion along the direction orthogonal to the upper surface of the substrate.

16. The display device of claim 15, further comprising:
a terminal disposed in the peripheral area adjacent to the first side of the display area,
wherein the power supply line further comprises a connection portion extending in a direction crossing the main power supply line portion and connecting the main power supply line portion with the terminal.

17. The display device of claim 16, wherein an edge of the connection portion comprises a concavo-convex surface.

18. The display device of claim 11, further comprising:
a plurality of driving voltage lines extending onto the display area and electrically connected to the thin film transistor,
wherein the power supply line supplies a first power supply to the plurality of driving voltage lines.

19. The display device of claim 11, further comprising:
a thin film encapsulation layer covering the display area and including at least one organic encapsulation layer and at least one inorganic encapsulation layer,
wherein the at least one organic encapsulation layer extends to the peripheral area to cover the barrier layer.

20. A display device comprising:
a substrate;
a display area and a peripheral area adjacent to the display area defined above the substrate;
a power supply line positioned above the substrate;
an insulating layer disposed on the power supply line;
a first inorganic encapsulation layer disposed on the insulating layer;
an organic encapsulation layer disposed on the first inorganic encapsulation layer;
a second inorganic encapsulation layer disposed on the organic encapsulation layer;
a barrier layer disposed on the insulating layer in the peripheral are, wherein a side of the barrier layer includes a plurality of protruding portions with spaces between the protruding portions; and
a dam disposed on the insulating layer in the peripheral area, wherein the dam is positioned further away from the display area than the barrier layer.

21. The display device of claim 20, wherein an uppermost level of the dam facing away from the substrate is further away from the substrate than an uppermost level of the barrier layer facing away from the substrate.

22. The display device of claim 20, further comprising a trench formed in the insulating layer having a predetermined width between the barrier layer and the dam.

23. The display device of claim 20, wherein the barrier layer includes a material different from a material included in the insulating layer.

24. The display device of claim 20, wherein the dam includes a material different from a material included in the insulating layer.

* * * * *